US008958513B1

(12) United States Patent
Novellini et al.

(10) Patent No.: US 8,958,513 B1
(45) Date of Patent: Feb. 17, 2015

(54) CLOCK AND DATA RECOVERY WITH INFINITE PULL-IN RANGE

(71) Applicant: Xilinx, Inc., San Jose, CA (US)

(72) Inventors: Paolo Novellini, Gorgonzola (IT); Martin J. Kellermann, Egmating (DE)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 13/837,864

(22) Filed: Mar. 15, 2013

(51) Int. Cl.
*H04L 7/00* (2006.01)
*H04L 7/033* (2006.01)

(52) U.S. Cl.
CPC .................................... *H04L 7/0337* (2013.01)
USPC .......................................... 375/355; 375/373

(58) Field of Classification Search
CPC ................ H04L 7/033; H04L 27/2657; H04L 2027/0071; H04L 2027/0063; H04L 2027/0046; H04L 2027/0052; H04L 2027/0036; H03L 7/0805; H03L 7/06; H03L 7/07
USPC ......... 375/322–327, 294, 215, 354–355, 373, 375/375, 376
See application file for complete search history.

(56) References Cited

U.S. PATENT DOCUMENTS

| | | | | |
|---|---|---|---|---|
| 4,953,041 A | * | 8/1990 | Huber | 360/46 |
| 5,463,351 A | * | 10/1995 | Marko et al. | 331/1 A |
| 5,608,357 A | * | 3/1997 | Ta et al. | 331/57 |
| 5,774,510 A | * | 6/1998 | Izzard | 375/375 |
| 5,850,422 A | * | 12/1998 | Chen | 375/371 |
| 5,950,115 A | * | 9/1999 | Momtaz et al. | 455/73 |
| 6,016,080 A | * | 1/2000 | Zuta et al. | 331/25 |
| 6,118,316 A | * | 9/2000 | Tamamura et al. | 327/156 |
| 6,310,521 B1 | * | 10/2001 | Dalmia | 331/11 |
| 6,316,966 B1 | * | 11/2001 | Chang et al. | 327/2 |
| 6,803,828 B2 | * | 10/2004 | Tan et al. | 331/17 |
| 6,807,225 B1 | * | 10/2004 | Tonietto et al. | 375/219 |
| 6,868,134 B2 | * | 3/2005 | Yoshizaki | 375/354 |
| 6,901,126 B1 | * | 5/2005 | Gu | 375/355 |
| 6,937,685 B2 | * | 8/2005 | Tang | 375/376 |
| 7,050,777 B2 | * | 5/2006 | Cai | 455/295 |
| 7,089,444 B1 | * | 8/2006 | Asaduzzaman et al. | 713/600 |
| 7,102,446 B1 | * | 9/2006 | Lee et al. | 331/11 |
| 7,103,279 B1 | * | 9/2006 | Koh et al. | 398/115 |
| 7,197,102 B2 | * | 3/2007 | Rhee et al. | 375/376 |

(Continued)

OTHER PUBLICATIONS

Hanumolu, P.K., et al., "A Wide-Tracking Range Clock and Data Recovery Circuit", IEEE Journal of Solid-Sate Circuits, vol. 43, No. 2, Feb. 2008, pp. 425-439.

(Continued)

Primary Examiner — Emmanuel Bayard
(74) Attorney, Agent, or Firm — Kin-Wah Tong

(57) ABSTRACT

A device and method for clock and data recovery are disclosed. For example, an integrated circuit comprises a first branch for recovering a clock signal from an input signal. The first branch includes a phase and frequency detector for detecting a phase and a frequency of the clock signal and a numerically controlled oscillator that is controlled by the phase and the frequency of the clock signal from the phase and frequency detector. The integrated circuit also includes a second branch for recovering a data signal from the input signal. The second branch includes a pre-settable numerically controlled oscillator that is pre-settable with the phase and the frequency of the clock signal from the numerically controlled oscillator. The second branch also includes a sample selector that is controlled by the pre-settable numerically controlled oscillator for recovering the data signal.

18 Claims, 7 Drawing Sheets

(56) References Cited

U.S. PATENT DOCUMENTS

| | | | |
|---|---|---|---|
| 7,227,913 B1* | 6/2007 | Hein et al. | 375/327 |
| 7,342,521 B1* | 3/2008 | Liu | 341/100 |
| 7,457,393 B2* | 11/2008 | Casper et al. | 375/376 |
| 7,505,541 B1* | 3/2009 | Brunn et al. | 375/360 |
| 7,555,087 B1* | 6/2009 | Asaduzzaman et al. | 375/359 |
| 7,623,600 B2* | 11/2009 | Momtaz et al. | 375/345 |
| 7,743,288 B1* | 6/2010 | Wang | 714/704 |
| 7,860,203 B1* | 12/2010 | Shumarayev et al. | 375/354 |
| 7,961,054 B2* | 6/2011 | Edwards et al. | 331/16 |
| 8,391,343 B1* | 3/2013 | Chuang et al. | 375/219 |
| 8,531,244 B2* | 9/2013 | Shibata et al. | 331/11 |
| 8,666,010 B1* | 3/2014 | Novellini | 375/371 |
| 2002/0057118 A1* | 5/2002 | Tang | 327/158 |
| 2002/0075981 A1* | 6/2002 | Tang et al. | 375/372 |
| 2002/0186087 A1* | 12/2002 | Kim et al. | 331/100 |
| 2002/0186804 A1* | 12/2002 | Dorschky et al. | 375/376 |
| 2003/0034850 A1* | 2/2003 | Sanduleanu | 331/58 |
| 2003/0035503 A1* | 2/2003 | Sanduleanu | 375/376 |
| 2003/0042958 A1* | 3/2003 | Sanduleanu | 327/238 |
| 2003/0078022 A1* | 4/2003 | Cai | 455/260 |
| 2003/0227310 A1* | 12/2003 | Iwata | 327/165 |
| 2003/0227989 A1* | 12/2003 | Rhee et al. | 375/376 |
| 2004/0164782 A1* | 8/2004 | Zampetti et al. | 327/292 |
| 2004/0232951 A1* | 11/2004 | Tan et al. | 327/105 |
| 2004/0258188 A1* | 12/2004 | Kim et al. | 375/376 |
| 2005/0063494 A1* | 3/2005 | Gregorius et al. | 375/340 |
| 2005/0108600 A1* | 5/2005 | Arguelles | 714/701 |
| 2005/0135471 A1* | 6/2005 | Tonietto et al. | 375/233 |
| 2005/0135510 A1* | 6/2005 | Momtaz | 375/340 |
| 2005/0212566 A1* | 9/2005 | Wilson | 327/105 |
| 2006/0083328 A1* | 4/2006 | Green et al. | 375/295 |
| 2006/0104399 A1* | 5/2006 | Byun et al. | 375/376 |
| 2006/0222134 A1* | 10/2006 | Eldredge et al. | 375/371 |
| 2007/0002993 A1* | 1/2007 | Wang et al. | 375/374 |
| 2007/0047689 A1* | 3/2007 | Menolfi et al. | 375/376 |
| 2007/0121772 A1* | 5/2007 | Wada | 375/371 |
| 2007/0183552 A1* | 8/2007 | Sanders et al. | 375/376 |
| 2007/0201541 A1* | 8/2007 | Chuang et al. | 375/221 |
| 2007/0248201 A1* | 10/2007 | Ker et al. | 375/355 |
| 2007/0286321 A1* | 12/2007 | Gupta et al. | 375/375 |
| 2008/0056423 A1* | 3/2008 | Jeon | 375/359 |
| 2008/0063129 A1* | 3/2008 | Voutilainen | 375/376 |
| 2008/0107422 A1* | 5/2008 | Cole | 398/135 |
| 2008/0112522 A1* | 5/2008 | Fukuda et al. | 375/371 |
| 2008/0212730 A1* | 9/2008 | Tang et al. | 375/376 |
| 2008/0265998 A1* | 10/2008 | Wood | 331/2 |
| 2008/0292040 A1* | 11/2008 | Menolfi et al. | 375/376 |
| 2008/0298476 A1* | 12/2008 | Bereza et al. | 375/257 |
| 2009/0116585 A1* | 5/2009 | Black et al. | 375/316 |
| 2010/0040182 A1* | 2/2010 | Yang et al. | 375/355 |
| 2010/0166132 A1* | 7/2010 | Tang et al. | 375/372 |
| 2011/0058635 A1* | 3/2011 | Ko et al. | 375/362 |
| 2011/0285434 A1* | 11/2011 | Shumarayev et al. | 327/156 |
| 2011/0311008 A1* | 12/2011 | Slezak et al. | 375/353 |
| 2012/0008727 A1* | 1/2012 | Mohajeri et al. | 375/376 |
| 2012/0106689 A1* | 5/2012 | Byun | 375/374 |
| 2012/0147266 A1* | 6/2012 | Sridharan et al. | 348/515 |
| 2013/0009682 A1* | 1/2013 | Kyles | 327/156 |
| 2013/0093482 A1* | 4/2013 | Asaduzzaman et al. | 327/157 |
| 2013/0188762 A1* | 7/2013 | Mukherjee et al. | 375/371 |

OTHER PUBLICATIONS

Novellini, P., et al., "Dynamically Programmable DRU for High-Speed Serial I/O", Application Note: Virtex-5 FPGAs, XAPP875 (v1.1), Jan. 13, 2010, pp. 1-14, Xilinx, Inc., San Jose, CA USA.

* cited by examiner

CLOCK AND DATA RECOVERY WITH INFINITE PULL-IN RANGE

FIELD OF THE INVENTION

The present disclosure relates generally to clock and data recovery circuits.

BACKGROUND OF THE INVENTION

Various standards such as the Video Electric Standards Association (VESA) DisplayPort, Universal Serial Bus (USB) 3.0 and Serial ATA (SATA), specify certain performance requirements for a receiver. For example, a receiver may be required to (1) have a bandwidth that is wide enough to be able to track the specified input jitter and (2) have a wide enough pull-in range to be able to lock to incoming signals in the frequency range specified in the standard. The second requirement is more stringent than the first. Thus, a typical design criterion is to make the bandwidth wide enough to fulfill the second requirement. However, once such a receiver is locked, it operates at much wider bandwidth than is required. This can have several undesirable effects, such as possible limitations on high frequency jitter tolerance of the receiver itself.

SUMMARY OF THE INVENTION

In one embodiment, a device for clock and data recovery is disclosed. For example, an integrated circuit comprises a first branch for recovering a clock signal from an input signal. The first branch includes a phase and frequency detector for detecting a phase and a frequency of the clock signal and a numerically controlled oscillator that is controlled by the phase and the frequency of the clock signal from the phase and frequency detector. The integrated circuit also includes a second branch for recovering a data signal from the input signal. The second branch includes a pre-settable numerically controlled oscillator that is pre-settable with the phase and the frequency of the clock signal from the numerically controlled oscillator. The second branch also includes a sample selector that is controlled by the pre-settable numerically controlled oscillator for recovering the data signal.

In various embodiments: the input signal comprises an alternating pattern of the clock signal and the data signal; the second branch further comprises a delay element, for delaying the input signal by at least one clock cycle; the first branch further comprises a pattern detector for detecting a clock pattern of the clock signal; the clock pattern comprises an alternating bit pattern of ones and zeros; the pre-settable numerically controlled oscillator is further controlled by the pattern detector, wherein when the clock pattern is detected by the pattern detector, the pattern detector via a trigger signal causes the pre-settable numerically controlled oscillator to be pre-set with the phase and the frequency of the clock signal from the numerically controlled oscillator; the pre-settable numerically controlled oscillator blocks the phase and the frequency of the clock signal from the numerically controlled oscillator when the trigger signal is not received; the second branch further comprises a phase detector in a feedback loop with the pre-settable numerically controlled oscillator, wherein the phase detector is for receiving the input signal and detecting a phase of the data signal in the input signal; the first branch further comprises a sample selector that is controlled by the numerically controlled oscillator for selecting samples from the input signal; the integrated circuit further comprises a splitter for splitting the input signal to the first branch and to the second branch; the numerically controlled oscillator and the phase and frequency detector in the first branch comprise a feedback loop; the input signal comprises digitally oversampled data; the numerically controlled oscillator comprises an N-bit register; the pre-settable numerically controlled oscillator comprises a multiplexer and an N-bit register, wherein the multiplexer is for selecting a phase from the numerically controlled oscillator in the first branch or a phase from a phase detector in the second branch; the first branch further comprises a low-pass filter between the phase and frequency detector and the numerically controlled oscillator; the low-pass filter comprises a proportional and integral filter; the second branch further comprises a pre-settable low-pass filter that is controlled by the low-pass filter in the first branch and a pattern detector in the first branch; the pre-settable low-pass filter comprises, a proportional and integral filter, wherein the proportional and integral filter comprises a multiplexer for selecting a status from the low-pass filter of the first branch or a phase detector error from a phase detector in the second branch; the first branch and the second branch comprise logical groupings on a single integrated circuit.

According to another embodiment, an integrated circuit comprises a phase and frequency detector for detecting a phase and a frequency of a clock signal in an input signal and a numerically controlled oscillator that is controlled by the phase and the frequency of the clock signal from the phase and frequency detector. The integrated circuit also includes a pre-settable numerically controlled oscillator that is pre-settable with the phase and the frequency of the clock signal from the numerically controlled oscillator and a sample selector that is controlled by the pre-settable numerically controlled oscillator for recovering a data signal in the input signal.

According to another embodiment, a method of adaptively tuning an integrated circuit is provided. For example, the method includes recovering a clock signal from an input signal by detecting a phase and a frequency of the clock signal and driving a numerically controlled oscillator by the phase and the frequency of the clock signal that is detected. The method further includes recovering a data signal from the input signal by pre-setting a pre-settable numerically controlled oscillator with a phase and a frequency from the numerically controlled oscillator and selecting data samples from the input signal based upon a phase and frequency from the pre-settable numerically controlled oscillator.

BRIEF DESCRIPTION OF THE DRAWINGS

Accompanying drawings show exemplary embodiments in accordance with one or more aspects of the disclosure; however, the accompanying drawings should not be taken to limit the disclosure to the embodiments shown, but are for explanation and understanding only.

To facilitate understanding, identical reference numerals have been used, where possible, to designate identical elements that are common to the figures.

DETAILED DESCRIPTION OF THE DRAWINGS

The present disclosure relates generally to devices and methods for performing clock and data recovery in an integrated circuit. For example, the present disclosure can be implemented within an integrated circuit (IC), e.g., a programmable logic device (PLD), a dedicated IC, a field programmable gate array (FPGA), and the like, to receive an input data signal and recover both clock and data signals from the input data signal.

Various standards such as DisplayPort, Universal Serial Bus (USB) 3.0 and SATA, specify certain performance requirements for a receiver. For example, a receiver may be required to (1) have a bandwidth that is wide enough to be able to track the specified input jitter and (2) have a wide enough pull-in range to be able to lock to incoming signals in the frequency range specified in the standard. The second requirement is more stringent than the first. Thus, a typical design criterion is to make the bandwidth wide enough to fulfill the second requirement. However, once such a receiver is locked, it operates at much wider bandwidth than is required. This can have several undesirable effects, such as possible limitations on high frequency jitter tolerance of the receiver itself.

Embodiments of the present disclosure disclose a device, e.g., a receiver, having a wide or infinite pull-in bandwidth, or pull-in range, but with a receiver bandwidth that is optimized for the expected frequency range of data signals that may be received. Advantageously, by employing embodiments of the present disclosure, a designer can optimize the clock and data recovery circuit bandwidth to only fulfill the bandwidth requirement. In one embodiment, a clock and data recovery circuit of the present disclosure comprises two paths: one for recovering clock signals and the other for recovering data signals. In particular, embodiments of the present disclosure relate to input data streams having embedded clock signals. For instance, the input signal may comprise a time period carrying data followed by a period where only a clock signal is conveyed, followed by another period of data signaling, and so forth. Accordingly, the first path is for locking to the incoming clock signal where the second path is for recovering the actual data in the input stream. In one embodiment, the period of the clock signal may be twice as long as the period of the data signal. In one embodiment, the synchronization of the first path to the clock signal is used by the second path to quickly lock to the incoming data signal. Advantageously, the clock and data recovery circuit can lock to the incoming data rate in only a single clock cycle after the lock is obtained on the clock signal in the input stream. An exemplary clock and data recovery circuit is discussed in greater detail below in connection with FIG. 4.

Figure 1:
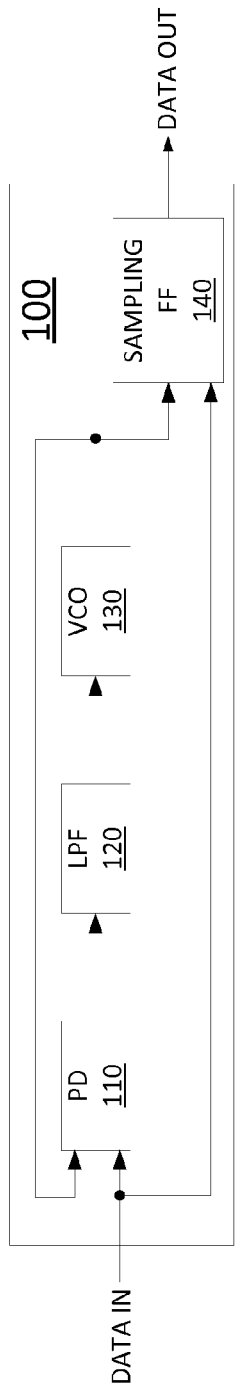
FIG. 1 illustrates a block diagram of a data recovery circuit.

To better understand the present disclosure, FIG. 1 illustrates a high level analog data receiver, e.g., an integrated circuit. In one embodiment, the clock and data recovery (CDR) circuit 100 is based upon a phase lock loop (PLL) and comprises a phase detector (PD) 110 which measures the phase difference between an incoming signal and that of a voltage controlled oscillator (VCO) 130. For example, the phase detector may comprise a mixer/combiner which multiplies two input signals and has an output that includes a component proportional to the phase difference between the two inputs signals and a sinusoidal component. The output of the phase detector 110 drives the low-pass filter (LPF) 120. The low pass filter (LPF) 120 eliminates and/or reduces any high frequency noise in the output from phase detector 110. For example, the LPF 120 may comprise a RC circuit. In addition to eliminating high frequency noise, the LPF 120 also blocks the sinusoidal component, leaving only the DC component that is proportional to the phase difference.

The output of the low-pass filter 120 drives the voltage controlled oscillator (VCO) 130. In particular, the VCO 130 outputs a periodic signal, e.g., a sinusoidal signal, or a square wave, rectangular wave, triangular wave, and so forth with a frequency that is proportional to the input voltage. The output of the voltage controlled oscillator 130 comprises feedback to the phase detector 110 and additionally drives the sampling flip-flop (FF) 140. For example, the sampling flip-flop 140 may sample the incoming data at a sampling rate based upon the output of the voltage controlled oscillator 130. Thus, in one embodiment the sampling flip-flop 140 may have several sampling edges per bit of the incoming data, e.g., eight times per bit, 16 times per bit, or even a non-integer relation. The voltage of the phase detector 110, which is proportional to the phase error, is filtered by the low-pass filter (LPF) 120, and corrects continuously the voltage controlled oscillator (VCO) 130 phase.

The CDR circuit 100 can be used to recover both data signals and clock signals, e.g., where a clock signal may be embedded within an input signal that also conveys data. However, even assuming that the clock rate and the data rate are the same, in many cases a circuit of this design will lock to the incoming clock/data rate more slowly than desirable for many applications. In addition, if the frequency of the incoming data is too far away from the center frequency of the VCO 130, the PLL 110 may not lock at all. For instance, the circuit 100 may be able to easily track any phase difference between the VCO 130 and the input signal, but is much more limited in the frequency range of the input signal which it can track.

Figure 2:
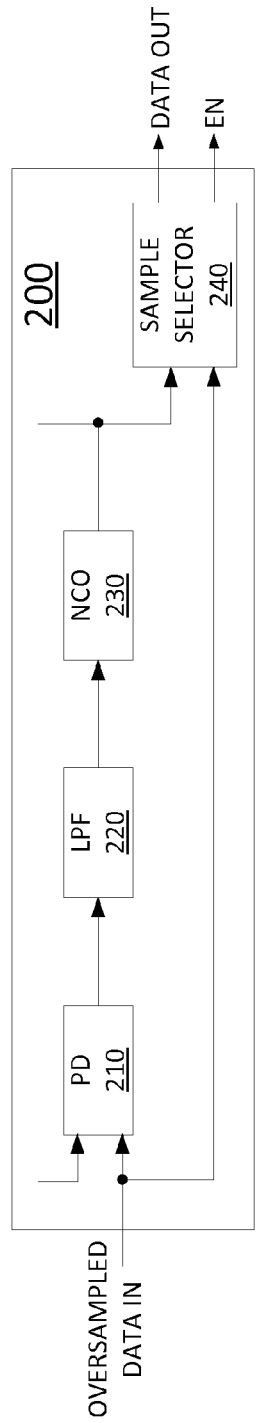
FIG. 2 illustrates a block diagram of a digital data recovery circuit.

FIG. 2 illustrates a digital receiver, e.g., a data recovery unit (DRU) 200. DRU 200 includes a phase detector (PD) 210, a low-pass filter (LPF) 220, a numerically controlled oscillator (NCO) 230 and a sample selector (SS) 240. Each of these components has similar functions to analog counterparts described above in connection with FIG. 1. However, DRU 200 receives oversampled digital data as an input. The PD 210 compares two inputs: (1) the phase of the incoming data with (2) the phase of the output from the numerically controlled oscillator (NCO) 230. For example, the PD 210 may output a one "1" or high value any time that either the incoming signal or the output of the NCO 230 is high and the other input is not. For instance, the PD 210 may comprise an exclusive-or operation. In one embodiment, the NCO 230 is based upon the design of FIG. 6, e.g., a shift register/accumulator, as described below. In addition, in one embodiment, the low pass filter 220 is based upon a shift register/accumulator as described below in connection with FIG. 8. The sample selector (SS) 240 associates a phase to each incoming data sample and extracts the one that is more closely located to the center of the eye diagram. For example, the circuit 200 may be locked with the phase and frequency of the incoming signal, but a static phase difference (π) between the NCO 230 output and the incoming signal may remain.

Both of the circuits 100 and 200 in FIGS. 1 and 2, respectively have a receiver bandwidth that depends on the low pass filter settings and a pull-in bandwidth that is proportional to the receiver bandwidth.

Figure 3:
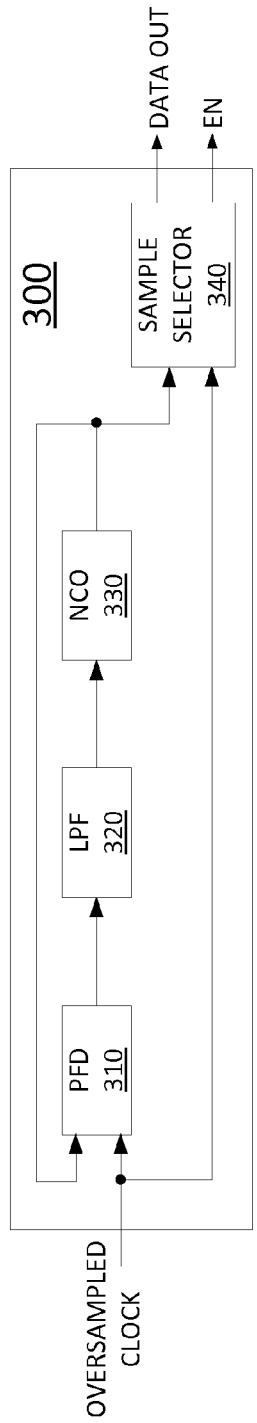
FIG. 3 illustrates a block diagram of a digital clock and data recovery circuit.

FIG. 3 illustrates another embodiment of a receiver, e.g., a clock recovery unit 300. As compared to the data recovery unit 200 of FIG. 2, the clock recovery unit 300 is only used to recover a clock signal. The key difference between CDR unit 300 and DRU 200 is the phase and frequency detector (PFD) 310. Clock recovery unit 300 further includes a low-pass filter (LPF) 320, a numerically controlled oscillator (NCO) 330 and a sample selector (SS) 340, which function the same as or similar to the LPF 220, NCO 230 and SS 240 in FIG. 2. Ideally, the clock recovery unit 300 recovers a clock pattern of repeating/alternating ones and zeros, e.g., "10101010 . . . ." Notably, the clock recovery unit 300, in FIG. 3 has an infinite pull in range and can track to any incoming frequency. However, it is only able to recover a clock signal in the input signal (and not the data signal within the input signal). Namely, because it is designed to have infinite pull-in bandwidth, the bandwidth of the receiver (i.e., clock recovery unit 300) is greater than ideal for receiving data once the receiver is locked to the incoming data. For example, components of the low-pass filter 320 may be tuned to allow infinite pull-in, but may allow too much high frequency noise to affect the NCO 330 for many applications. However, when this circuit is only used for clock recovery, then high frequency noise is no longer a relevant issue as discussed below.

Figure 4:
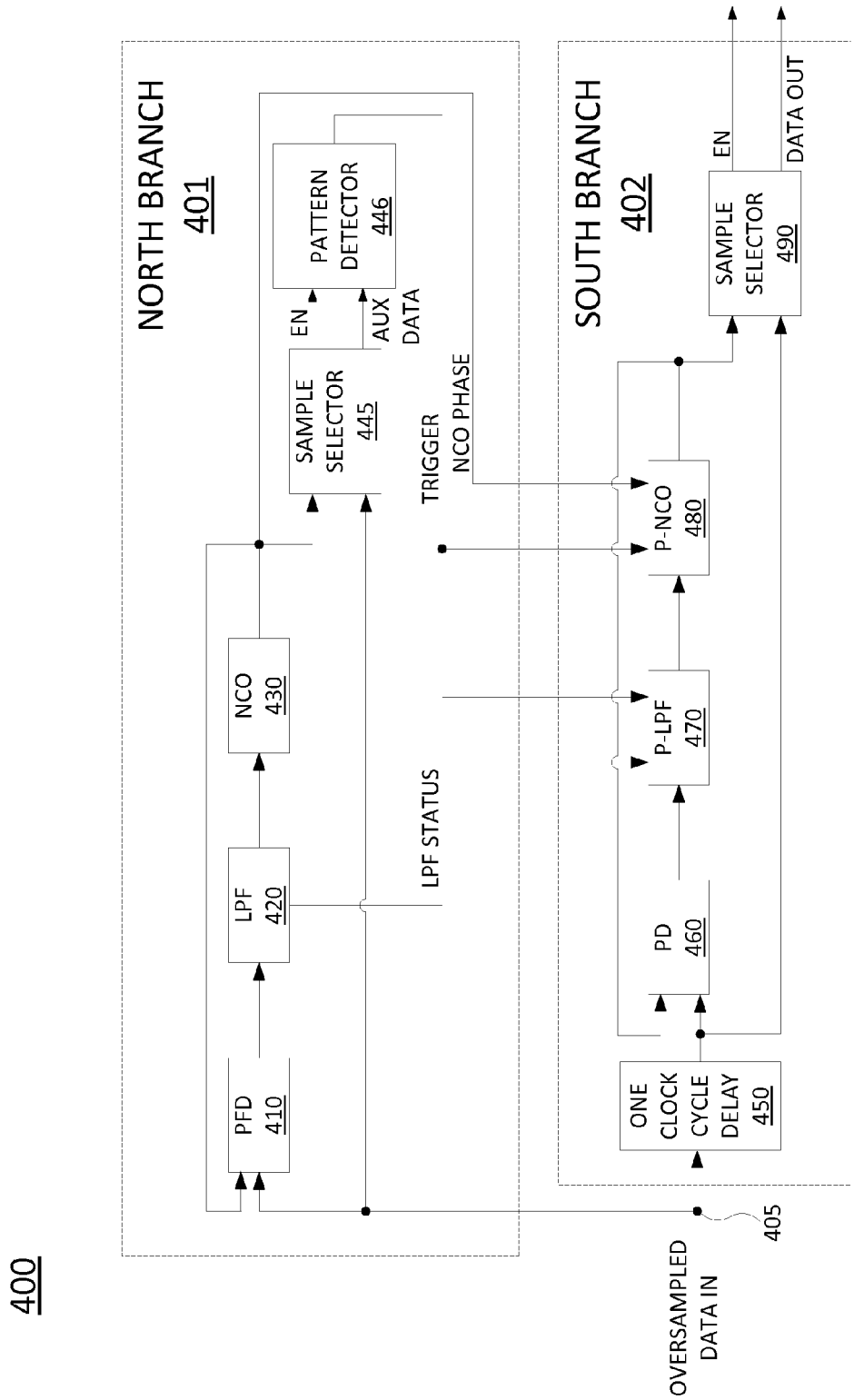
FIG. 4 illustrates a block diagram of a clock and data recovery circuit according to one embodiment of the present disclosure.

FIG. 4 illustrates an exemplary clock and data recovery (CDR) circuit 400 according to one embodiment of the present disclosure. As illustrated in FIG. 4, CDR circuit 400 includes two "branches": a first branch, or "north branch" 401, and a second branch, or "south branch" 402. It should be noted that in one embodiment, the two branches are simply logical groupings of components. Thus, in other embodiments a particular circuit layout may include an arrangement where any one or more components of either branch is located in a different position or in a different orientation than as shown in FIG. 4. For example, signals from different components of the north branch 401 comprise inputs to various components of the south branch 402. Thus, the two branches are not completely isolated paths. As such, the components may be interleaved and/or placed in any position that is convenient in an exemplary integrated circuit, e.g., to reduce chip size, reduce connection distance between components, and so forth.

In one embodiment, CDR circuit 400 comprises a splitter 405 for splitting an input signal into two paths, one for each of the branches. The north branch 401 receives the input signal on one of the paths and performs a clock recovery function on any clock signals that may be found within the input signal. For instance, the input signal may comprise interleaved clock and data signals as shown in the top line of FIG. 5. Thus, in one embodiment the north branch 401 is for recovering only the clock signal within the input signal. The phase and frequency detector (PFD) 410, low-pass filter (LPF) 420, numerically controlled oscillator (NCO) 430 and sample selector (SS) 445 operate in the same or a similar manner as discussed above for PFD 310, LPF 320, NCO 330 and SS 340 in FIG. 3. In one embodiment, the north branch 401 also includes a pattern detector 446 for detecting a clock pattern, e.g., alternating ones and zeros ("1010101 . . ."). For instance, if the current bits of the input signal comprise clock data and the north branch 401 is properly locked, the sample selector 445 should sample a clock pattern of "1010101 . . . " as an example. The pattern detector 446 confirms that the samples conform to this pattern. However, if the current bits of the input signal comprise "data" and not the clock pattern, then the north branch 401 will drift from the clock rate, but nevertheless continue to sample the input data at sample selector 445. For instance, the bit pattern sampled by the sample selector 445 may comprise "111001100101000110 . . . " Accordingly, the pattern detector 446 determines that the current bits do not comprise the clock signal, e.g., since it is not the designated clock pattern of alternating ones and zeros ("1010101 . . .").

In general terms, the clock signal recovery of the north branch 401 is used to pre-set or pre-load the components of the south branch 402, which collectively performs data recovery on the incoming data of the input signal. In one embodiment, the south branch 402 comprises a phase detector (PD) 460, a pre-settable low-pass filter (P-LPF) 470, a pre-settable numerically controlled oscillator (P-NCO) 480 and a sample selector (SS) 490. In one embodiment, the south branch 402 further comprises a delay unit 450 for delaying the input signal at least one clock cycle. For example, this allows at least one time unit delay for the north branch 401 to lock to a clock signal before passing control signals to the south branch 402. In one embodiment, the bandwidth of the south branch 402 is tuned, e.g., by selecting components of the P-LPF 470, to fulfill a jitter tolerance requirement (e.g., based upon a standard, such as USB 3.0, DesignPort, and the like, and/or based upon other designer, system or application requirements). Accordingly, the south branch 402 may not lock on incoming data if the incoming data is at a frequency that is outside the pull-in range of the south branch 402. Nevertheless, the north branch 401 has infinite pull-in bandwidth and can lock to any incoming frequency/bit rate. However, the north branch 401 only operates on a clock signal. Thus, the CDR circuit 400 may lock to an incoming frequency when a clock signal first appears in the input data. In particular, the north branch 401 will lock to the clock and pre-set the south branch 402. When the actual data begins/resumes in the input stream, the south branch 402 will already be tuned to the correct frequency. Thus, even if the input signal is initially outside of the pull-in range of the south branch 402, the south branch 402 still locks to the input signal with the assistance of the north branch 401, based upon the clock signal embedded in the input signal.

The P-NCO 480, functions similar to NCO 430 (as well as NCO 330 and NCO 220 of FIGS. 2 and 3). However, in one embodiment P-NCO 480 receives further inputs from the NCO 430 and pattern detector 446. For example, in one embodiment, P-NCO 480 receives a NCO phase signal from NCO 430, and a trigger signal from pattern detector 446. In one embodiment, each time the trigger signal is high, e.g., a one "1", this causes the P-NCO 480 to be loaded with the NCO phase signal from the north branch 401. However, if the trigger remains low, or zero "0", i.e., where the incoming signal does not presently comprise a clock pattern, the P-NCO 480 does not accept the NCO phase signal from NCO 430 and continues to function according to the phase of the phase lock loop (PLL) of the south branch 402. In addition, the pre-settable low-pass filter (P-LPF) 470 is similar to LPF 420. However, it includes an additional input for a signal relating the status of the LPF 420. For example, each time the trigger signal is high, e.g., a one "1", this causes the P-LPF 470 to be loaded with the accumulated value(s) from LPF 420 from the north branch 401. Similarly, if the trigger remains low, or zero "0", i.e., where the incoming signal does not presently comprise a clock pattern, the P-LPF 470 does not accept the LPF status signal from LPF 420 and continues to function according to the phase of the phase lock loop (PLL) of the south branch 402.

Figure 5:
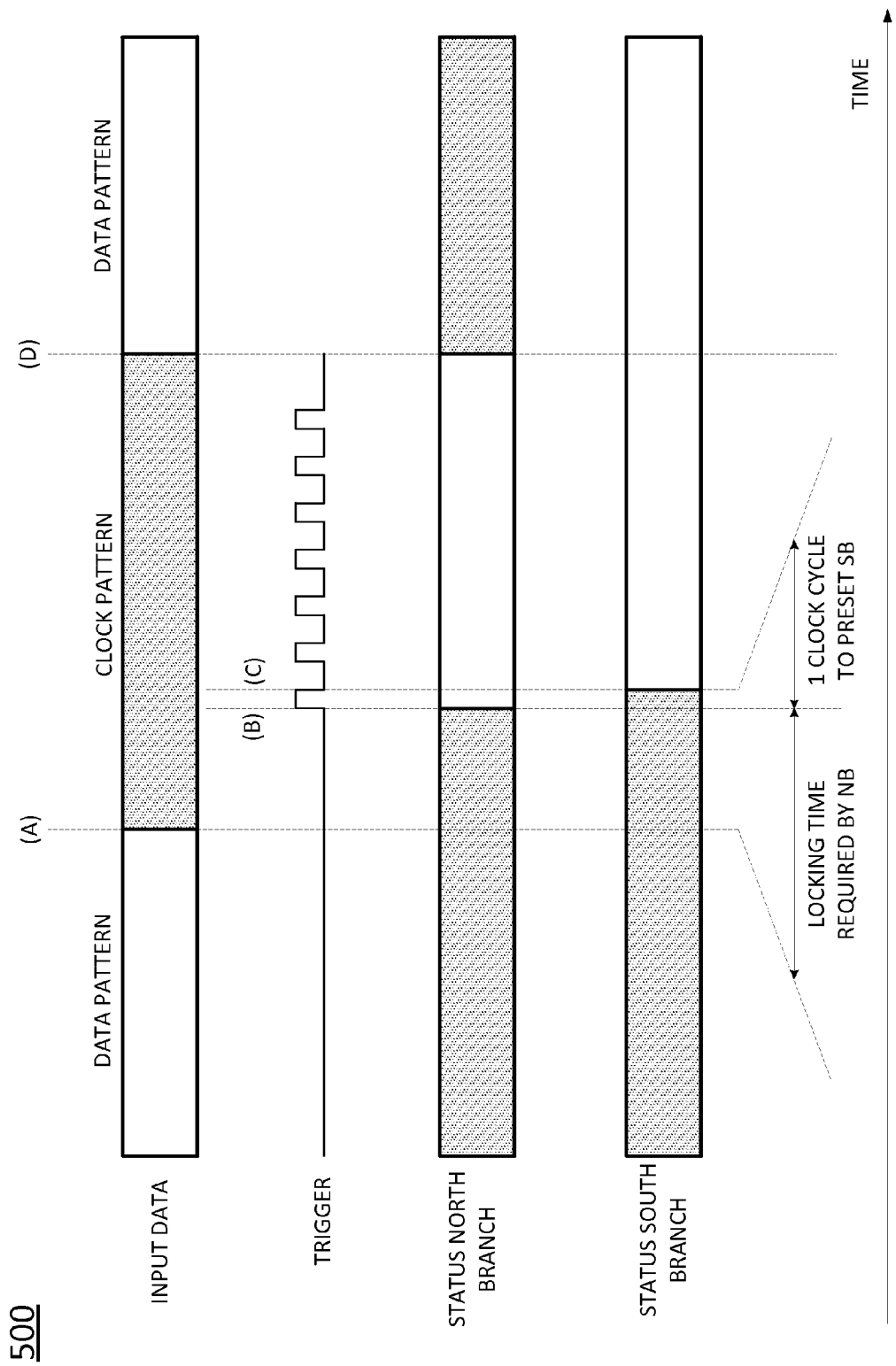
FIG. 5 illustrates a timing diagram of several signals within the clock and data recovery circuit of FIG. 4.

FIG. 5 shows an illustrative timing diagram 500 of several signals within the clock and data recovery circuit of FIG. 4. For example, as shown in the first line of FIG. 5, in one embodiment the input signal comprises a data pattern, a clock pattern, a data pattern, and so forth. For instance, according to the DisplayPort standard, a periodic clock pattern is transmitted in the bit stream, specifically a clock pattern with a frequency that is half of the data rate. In this instance, in one embodiment additional components may be included between the north branch 401 and south branch 402 to account for the difference in the clock and data rates. From time zero up to time A, a data pattern appears on the input. If the incoming data rate/frequency is outside of the pull-in range of the south branch 402, the south branch will not lock. In addition, since the north branch 401 is only for recovering the clock/frequency of the input signal, and since there is no clock pattern in the input signal, the north branch 401 also does not lock. However, at time A, the clock pattern appears in the input signal. After some locking time required by the north branch 401, at time B, the north branch 401 locks to the clock pattern of the input signal and begins to oscillate at the correct frequency. This locking is shown in the third line of FIG. 5. Accordingly, the north branch 401 begins outputting the trigger pattern shown in the second line of FIG. 5.

In addition, after a single clock cycle, the north branch 401 sends a NCO phase signal, e.g., the output of the NCO, and the trigger to the south branch. Thus, at time C, a single clock cycle after the north branch 401 locks, the south branch 402 is also locked. This locking is shown in the fourth line of FIG. 5. Finally, at time D, the clock pattern ends and the data pattern again appears in the input stream. Thus, at time D the north branch 401 loses its lock on the input signal, since it only detects a clock pattern. However, since the south branch 402 has been pre-set to the correct data rate/frequency, the south branch 402 remains locked on the input signal.

Figure 6:
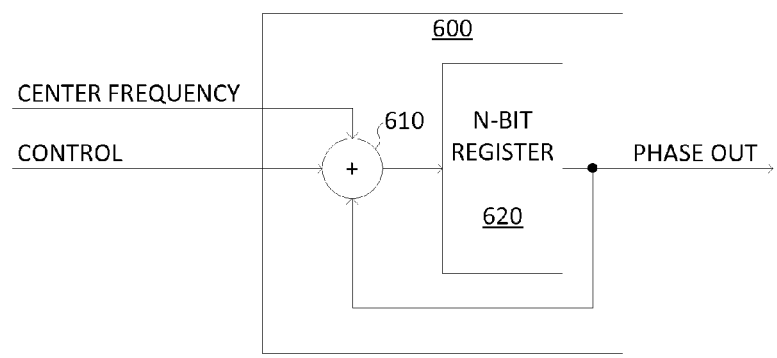
FIG. 6 illustrates a block diagram of a numerically controlled oscillator according to one embodiment of the present disclosure.

FIG. 6 illustrates one embodiment of a digital voltage controlled oscillator (VCO) 600 according to the present disclosure. For example, any one or more of the numerically controlled oscillators 230, 330, and 430 of FIGS. 2-4 may comprise digital VCO 600. In one embodiment, digital VCO 600 comprises a mixer, or combiner 610 and an N-bit register 620, e.g., a shift register/accumulator. In one embodiment, the combiner 610 has as inputs a control signal, such as from a low-pass filter in a path before the digital VCO 600, and a center frequency signal (e.g., a voltage which controls the center frequency of the VCO, the frequency at which the VCO will oscillate when not locked to any incoming data). The combiner 610 also has a feedback signal from the N-bit register 620 as an input. The digital VCO 600 outputs a periodic signal, e.g., a square wave, that, ideally, is phase synchronized, and therefore is also at the same frequency/data rate as the input signal to the receiver. In one embodiment, the center frequency voltage comprises a constant and the control signal comprises a value that indicates the phase difference between the input to the receiver and the output of the VCO 600. For example, if the control signal is zero "0", then the voltage signal input to the N-bit register 620 is a combination of the center frequency voltage signal and the current state of the N-bit register 620. If the control signal is positive, this indicates that the input signal is a little faster than K. If the control signal is negative, the input signal is slower than K. The feedback from the N-bit register 620 functions to drive the difference towards zero.

Figure 7:
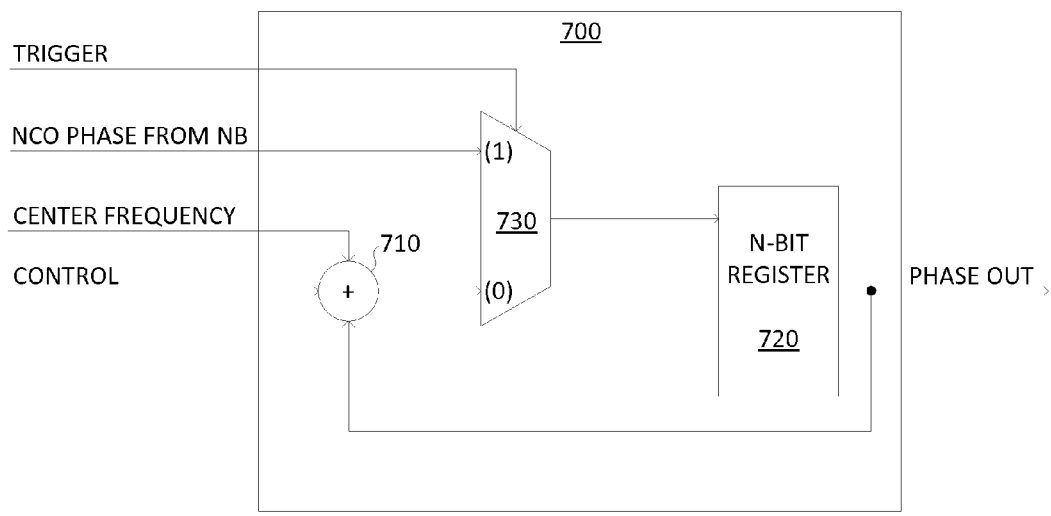
FIG. 7 illustrates a block diagram of a pre-settable numerically controlled oscillator according to one embodiment of the present disclosure.

FIG. 7 illustrates one embodiment of a pre-settable digital VCO 700 according to the present disclosure. For instance, in one embodiment P-NCO 480 in FIG. 4 may comprise the pre-settable digital VCO 700. In one embodiment, pre-settable digital VCO 700 comprises a mixer/combiner 710 which has as inputs a control signal (e.g., from a preceding low-pass filter or pre-settable low-pass filter), a center frequency signal, which may comprise a constant, and a feedback signal from N-bit register 720, e.g., a shift register/accumulator. In one embodiment, pre-settable digital VCO 700 also comprises a multiplexer 730 which has inputs from the combiner 710 and the output from a numerically controlled oscillator from a north branch (e.g., NCO 430 in FIG. 4). A trigger signal controls the multiplexer. In other words, the multiplexer 730 selects which input to pass to the N-bit register based upon whether the trigger signal is high or low. For example, if a clock signal is currently being processed by a north branch, the phase signal from the north branch is valid and should be used to charge, or set the pre-settable digital VCO 700. Thus, each time the trigger signal from the north branch is high, this indicates that the phase signal from the north branch is valid, causing the multiplexer to select the input on port (1). On the other hand, when the trigger remains low, the multiplexer may default to selecting the input on port (0).

Figure 8:
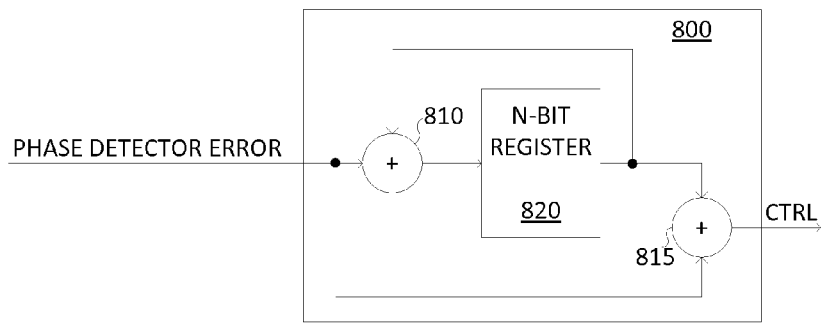
FIG. 8 illustrates a block diagram of a low-pass filter according to one embodiment of the present disclosure.

FIG. 8 illustrates one embodiment of a low-pass filter (LPF) 800 according to the present disclosure. For example, any one or more of LPFs 220, 320 or 420 of FIGS. 2-4 may comprise LPF 800. As shown in FIG. 8, LPF 800 includes a first mixer/combiner 810, an N-bit register 820, e.g., a shift register/accumulator, and a second mixer/combiner 815. The arrangement shown in FIG. 8 is often referred to as a proportional-integral (PI) filter. In one embodiment, the output of N-bit register 820 comprises an integral version of the input. In one embodiment, the output of LPF 800 comprises a control signal which is input to a digital VCO, or NCO such as described above.

Figure 9:
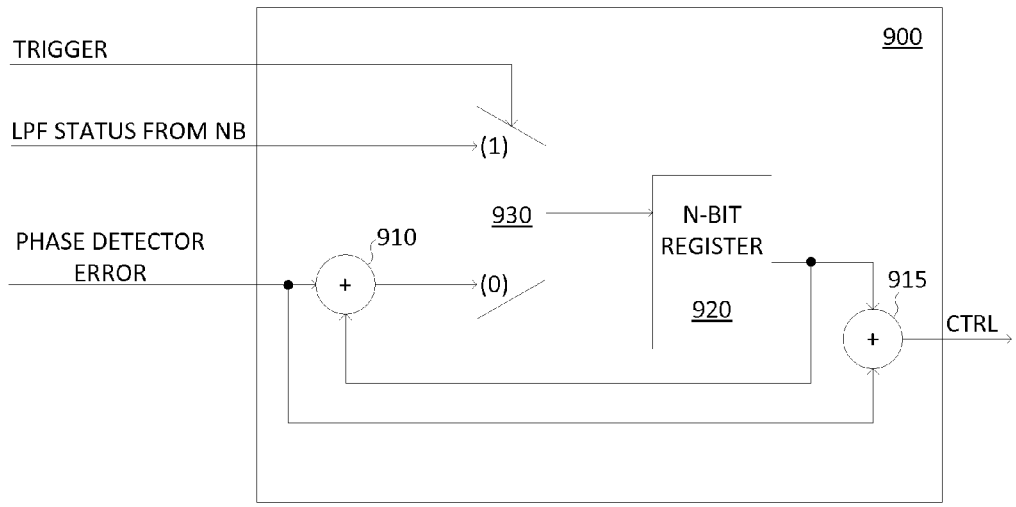
FIG. 9 illustrates a block diagram of a pre-settable low-pass filter according to one embodiment of the present disclosure.

FIG. 9 illustrates one embodiment of a pre-settable low-pass filter (P-LPF) 900 according to the present disclosure. Like the LFP 800 of FIG. 8, P-LFP 900 may comprise a PI filter. However, P-LFP 900 includes two mixer/combiners 910 and 915 and a multiplexer 930, in addition to the N-bit register 920, e.g., a shift register/accumulator. A first port, port (1) of the multiplexer 930 has as an input, the low-pass filter status from a north branch (e.g., from LPF 420 in FIG. 4). For example, the N-bit register 920 is filled with the value(s) from the LPF from the north branch. The second port, port (0) has as an input, the combination of a phase detector error signal (e.g., from a phase detector 460 in FIG. 4) and a feedback signal from the N-bit register 920. The output of P-LFP 900 comprises the output of combiner 915: the combination of the output of the N-bit register 920 and the phase detector error signal.

Figure 10:
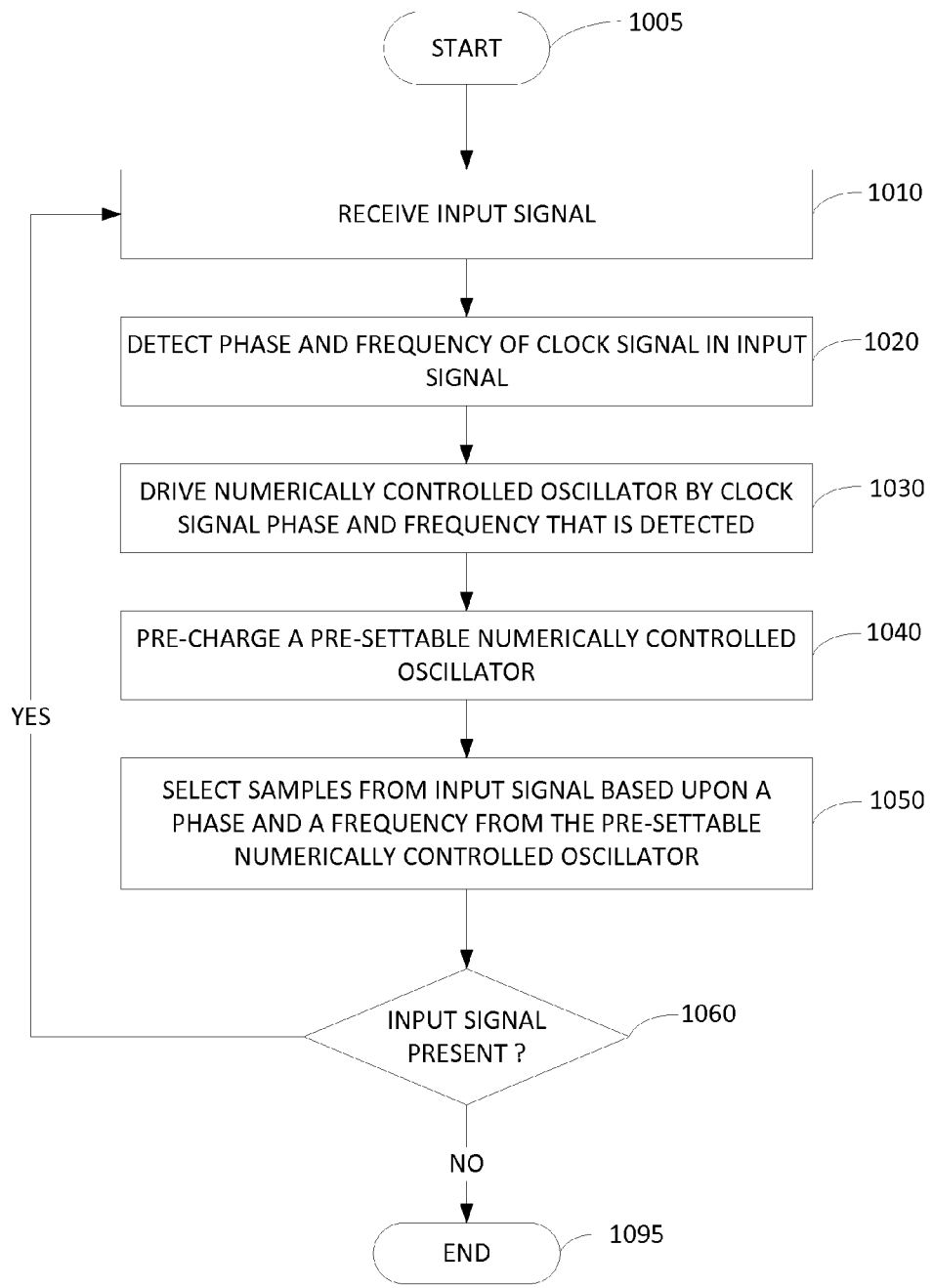
FIG. 10 illustrates a block diagram of a method for performing adaptive tuning of an integrated circuit.

FIG. 10 illustrates a block diagram of a method 1000 for performing adaptive tuning of an integrated circuit. For example, method 1000 can be performed by a circuitry as illustrated above and deployed in an integrated circuit, e.g., a FPGA. Alternatively, or in addition, any one or more of the steps, operations or functions of the method 1000 may be implemented by a general purpose computer having a processor, a memory, etc. as illustrated below in FIG. 11, specifically programmed to perform the steps, functions and/or operations of the method. The method starts in step 1005 and proceeds to step 1010.

In step 1010, the method receives an incoming input stream, or input signal. For instance, the input signal may comprise interleaved clock and data signals as shown in the top line of FIG. 5. In one embodiment, the method splits the input stream into two paths, or branches. For example, a first branch may be for recovering a clock signal from the input signal, while a second branch may be for recovering a data signal from the input signal.

In step 1020, the method detects a phase and frequency of a clock signal in the input signal. For example, a clock pattern of the clock signal may comprise alternating ones and zeros ("1010101 . . . "), or a similar repeating pattern. In one embodiment, the method detects the phase and frequency of the clock signal in the first branch. In one embodiment, the method implements any one or more of the functions and/or components described above in connection with FIG. 4, e.g., components of the "north branch" 401 in FIG. 4. In one embodiment, step 1020 comprises comparing a rate, or frequency, of the clock signal to that of a numerically controlled oscillator and determining a difference between the two.

In step 1030, the method drives a numerically controlled oscillator based upon the phase and frequency of the clock signal that is detected. For example, in one embodiment the method implements any one or more of the functions and/or components described above in connection with FIGS. 4 and 6, e.g., NCO 430 in the "north branch" 401 in FIG. 4. In one embodiment the method drives the numerically controlled oscillator with a signal pattern that indicates the difference between the output of the numerically controlled oscillator and the input clock signal. For instance, in one embodiment if the numerically controlled oscillator "lags" the input clock signal, the method forwards an "up" signal to speed up the numerically controlled oscillator. On the other hand, if the numerically controlled oscillator is faster than the input clock signal, the method forwards a "down" signal to slow down the numerically controlled oscillator. In one embodiment, step 1030 includes low pass filtering the signal pattern. In one embodiment, steps 1010 and 1020 collectively comprise the recovery of the clock signal from the input signal.

In step 1040, the method pre-sets a pre-settable numerically controlled oscillator. For example, in one embodiment the numerically controlled oscillator that is driven at step 1030 outputs a sinusoidal signal (e.g., a square wave) that is based upon a difference the phase and frequency of the clock signal that is detected and a feedback signal from the numerically controlled oscillator. Thus, in one embodiment, the method forwards the output of the numerically controlled oscillator to the pre-settable numerically controlled oscillator. In one embodiment, the pre-settable numerically controlled oscillator is thus caused to oscillate synchronously with the numerically controlled oscillator. However, in one embodiment, the method does not send, or rejects the output from the numerically controlled oscillator if a clock pattern/clock signal is not detected at step 1020. In one embodiment, the method employs a trigger signal which indicates whether the output from the numerically controlled oscillator is valid in order to determine whether to feed the pre-settable numerically controlled oscillator.

In step 1050, the method selects data samples from the input signal based upon the output from the pre-settable numerically controlled oscillator. For instance, the input signal may comprise interleaved clock and data signals. In one embodiment, when the input signal comprises the clock signal/clock pattern, the method detects the clock pattern and pre-sets the pre-settable numerically controlled oscillator at steps 1020-1040. When the clock pattern ends and a data signal/data pattern appears in the input signal, the pre-settable numerically controlled oscillator continues to oscillate according to the output of the numerically controlled oscillator (e.g., based on the clock pattern). Accordingly, in one embodiment the method may select samples from the input signal (which now comprises "data") at a sampling rate based upon the incoming clock signal.

It should be noted that in one embodiment, it is assumed that the data and clock in the input signal have a defined relationship (e.g., they have the same phase/frequency or have phases and frequencies with a defined integer or fractional relationship). In one embodiment, at step 1050 the method 1000 over-samples the incoming signal at a rate greater than the bit rate. For example, the method may sample the incoming signal at eight times per bit, 16 times per bit, a non-integer number of times per bit, and so forth. In one embodiment, for each bit the method selects a sample that is closest to the center of an eye diagram. In one embodiment, the data rate (e.g., the phase and frequency of the input signal/data signal) may have a small time variation. For example, a "broadband clock" may be used to minimize interference per Federal Communication Commission (FCC) or other standards. In one embodiment, the method implements the pre-settable numerically controlled oscillator in a phase lock loop (PLL) which tracks the input bit-rate/frequency. Thus, the pre-settable numerically controlled oscillator may follow the incoming rate as it diverges from the rate imparted to the pre-settable numerically controlled oscillator at step 1040. In one embodiment, steps 1040 and 1050 collectively comprise the recovery of the data signal from the input signal. In one embodiment, the clock signal that is recovered, as well as the data signal that is recovered, are output by the method 1000. For instance, the clock signal may be used to control the timing of various other components of a receiver/transceiver.

Following step 1050, the method proceeds to step 1060 where it determines whether the input signal is present. In one embodiment, steps 1010-1050 are repeated, e.g., continuously for as long as an incoming signal is present. Thus, in one embodiment if the input signal remains present, the method returns to step 1010 and continues to extract clock signals at steps 1020-1030 and data signals at steps 1040-1050, and so forth. If there is no longer any input signal present, the method proceeds from step 1060 to step 1095 where the method ends.

It should be noted that although not specifically specified, one or more steps of method 1000 may include a storing, displaying and/or outputting step as required for a particular application. In other words, any data, records, fields, tables, and/or intermediate results discussed in the method can be stored, displayed and/or outputted to another device as required for a particular application. Furthermore, steps, operations or blocks in FIG. 10 that recite a determining operation or involve a decision, do not necessarily require that both branches of the determining operation be practiced. In other words, one of the branches of the determining operation can be deemed as an optional step.

Figure 11:
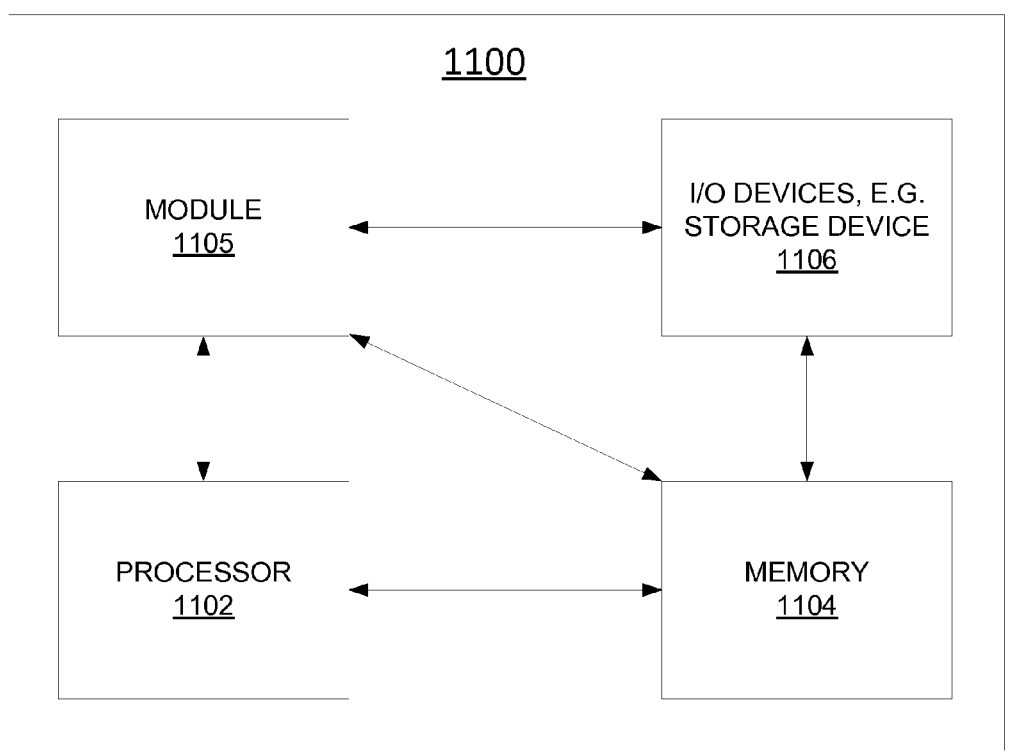
FIG. 11 illustrates a high level block diagram of a general purpose computer or a computing device suitable for use in performing the functions described herein.

FIG. 11 depicts a high level block diagram of a general purpose computer, a computing device, or a computing system 1100 suitable for use in performing some or all of the functions described herein. As depicted in FIG. 11, the system 1100 comprises a processor element 1102 (e.g., a CPU), a memory 1104, e.g., a random access memory (RAM) and/or a read only memory (ROM), a module 1105 for performing clock and data recovery, and various input/output devices 1106 (e.g., storage devices, including but not limited to, a memory device, a tape drive, a floppy drive, a hard disk drive or a compact disk drive, a receiver, a transmitter, a speaker, a display, a speech synthesizer, an output port, and a user input device (such as a keyboard, a keypad, a mouse, and the like)).

Embodiments of the present invention can be implemented in a combination of software and hardware, e.g., using application specific integrated circuits (ASIC), a PLD such as a FPGA, a general purpose computer or any other hardware equivalents such as microprocessors. In one embodiment, the present module or process for performing clock and data recovery can be loaded into memory 1104 and executed by processor 1102 to implement the functions as discussed above. As such, the present module or process 1105 for performing clock and data recovery (including associated data structures) of embodiments of the present invention can be stored on a non-transitory computer readable storage medium, e.g., RAM memory, magnetic or optical drive or diskette and the like.

Embodiments of the present disclosure may also be implemented in whole or in part by a tunable IC, e.g., a PLD and/or FPGA. More specifically, a programmable logic device (PLD) is a general-purpose device that can be programmed by a user to implement a variety of selected functions. One type of PLD is a Field Programmable Gate Array (FPGA), which typically includes an array of configurable logic blocks (CLBs) and a plurality of input/output blocks (IOBs). The CLBs are individually programmable and can be configured to perform a variety of logic functions on a few input signals. The IOBs can be configured to drive output signals from the CLBs to external pins of the FPGA and/or to receive input signals from the external FPGA pins. The FPGA also includes a programmable interconnect structure that can be programmed to selectively route signals among the various CLBs and IOBs to produce more complex functions of many input signals. The CLBs, IOBs, and the programmable interconnect structure are programmed by loading configuration data into associated memory cells that control various switches and multiplexers within the CLBs, IOBs, and the interconnect structure to implement logic and routing functions specified by the configuration data to implement a user design in the FPGA. An FPGA may also include other programmable and non-programmable resources. As such, the circuits shown above in connection with FIGS. 1-4 and 6-9 may be implemented in a plurality of CLBs that perform equivalent logic operations of any one or more components of any one or more of the circuits of FIGS. 1-4 and 6-9. Thus, in one embodiment the system 1100 can be configured to generate the necessary configuration data/instructions to configure an FPGA to perform the various functions as disclosed above.

While the foregoing describes exemplary embodiment(s) in accordance with one or more aspects of the present invention, other and further embodiment(s) in accordance with the one or more aspects of the present invention may be devised without departing from the scope thereof, which is determined by the claim(s) that follow and equivalents thereof. Claim(s) listing steps do not imply any order of the steps. Trademarks are the property of their respective owners.

What is claimed is:

1. An integrated circuit, comprising:
a first branch for recovering a clock signal from an input signal, the first branch comprising:
a phase and frequency detector for detecting a phase and a frequency of the clock signal;
a numerically controlled oscillator that is controlled by the phase and the frequency of the clock signal from the phase and frequency detector; and
a pattern detector for detecting a clock pattern of the clock signal; and a second branch for recovering a data signal from the input signal, the second branch comprising:
a pre-settable numerically controlled oscillator, wherein the pre-settable numerically controlled oscillator is pre-settable with the phase and the frequency of the clock signal from the numerically controlled oscillator, wherein the pre-settable numerically controlled oscillator is further controlled by the pattern detector, wherein when the clock pattern is detected by the pattern detector, the pattern detector via a trigger signal causes the pre-settable numerically controlled oscillator to be pre-set with the phase and the frequency of the clock signal from the numerically controlled oscillator; and
a sample selector that is controlled by the pre-settable numerically controlled oscillator for recovering the data signal.

2. The integrated circuit of claim 1, wherein the input signal comprises an alternating pattern of the clock signal and the data signal.

3. The integrated circuit of claim 1, wherein the second branch further comprises:
a delay element, for delaying the input signal by at least one clock cycle.

4. The integrated circuit of claim 1, wherein the clock pattern comprises an alternating bit pattern of ones and zeros.

5. The integrated circuit of claim 1, wherein the pre-settable numerically controlled oscillator blocks the phase and the frequency of the clock signal from the numerically controlled oscillator when the trigger signal is not received.

6. The integrated circuit of claim 1, wherein the second branch further comprises:
a phase detector in a feedback loop with the pre-settable numerically controlled oscillator, wherein the phase detector is for receiving the input signal and detecting a phase of the data signal in the input signal.

7. The integrated circuit of claim 1, wherein the first branch further comprises a sample selector that is controlled by the numerically controlled oscillator for selecting samples from the input signal.

8. The integrated circuit of claim 1, further comprising:
a splitter for splitting the input signal to the first branch and to the second branch.

9. The integrated circuit of claim 1, wherein the numerically controlled oscillator and the phase and frequency detector in the first branch comprise a feedback loop.

10. The integrated circuit of claim 1, wherein the input signal comprises digitally oversampled data.

11. The integrated circuit of claim 1, wherein the numerically controlled oscillator comprises an N-bit register.

12. The integrated circuit of claim 1, wherein the pre-settable numerically controlled oscillator comprises a multiplexer and an N-bit register, wherein the multiplexer is for selecting a phase from the numerically controlled oscillator in the first branch or a phase from a phase detector in the second branch.

13. The integrated circuit of claim 1, wherein the first branch further comprises:
a low-pass filter between the phase and frequency detector and the numerically controlled oscillator.

14. The integrated circuit of claim 13, wherein the low-pass filter comprises a proportional and integral filter.

15. The integrated circuit of claim 13, wherein the second branch further comprises:
a pre-settable low-pass filter that is controlled by the low-pass filter in the first branch and a pattern detector in the first branch.

16. The integrated circuit of claim 15, wherein the pre-settable low-pass filter comprises, a proportional and integral filter, wherein the proportional and integral filter comprises a multiplexer for selecting a status from the low-pass filter of the first branch or a phase detector error from a phase detector in the second branch.

17. A method, comprising:
recovering a clock signal from an input signal, the recovering the clock signal comprising:
  detecting a phase and a frequency of the clock signal; and
  driving a numerically controlled oscillator by the phase and the frequency of the clock signal that is detected;
  detecting a clock pattern of the clock signal; and
recovering a data signal from the input signal, wherein the recovering the data signal comprises:
  pre-setting a pre-settable numerically controlled oscillator with a phase and a frequency from the numerically controlled oscillator via a trigger signal when the clock pattern is detected; and
  selecting data samples from the input signal based upon a phase and frequency from the pre-settable numerically controlled oscillator.

18. An integrated circuit, comprising:
a phase and frequency detector for detecting a phase and a frequency of a clock signal in an input signal;
a numerically controlled oscillator that is controlled by the phase and the frequency of the clock signal from the phase and frequency detector;
a pattern detector for detecting a clock pattern of the clock signal;
a pre-settable numerically controlled oscillator, wherein the pre-settable numerically controlled oscillator is pre-settable with the phase and the frequency of the clock signal from the numerically controlled oscillator, wherein the pre-settable numerically controlled oscillator is further controlled by the pattern detector, wherein when the clock pattern is detected by the pattern detector, the pattern detector via a trigger signal causes the pre-settable numerically controlled oscillator to be pre-set with the phase and the frequency of the clock signal from the numerically controlled oscillator; and
a sample selector that is controlled by the pre-settable numerically controlled oscillator for recovering a data signal in the input signal.

* * * * *